(12) United States Patent
Marsala

(10) Patent No.: US 6,508,301 B2
(45) Date of Patent: Jan. 21, 2003

(54) COLD PLATE UTILIZING FIN WITH EVAPORATING REFRIGERANT

(75) Inventor: Joseph Marsala, Manchester, MA (US)

(73) Assignee: Thermal Form & Function, Manchester, MA (US)

(*) Notice: Subject to any disclaimer, the term of this patent is extended or adjusted under 35 U.S.C. 154(b) by 0 days.

(21) Appl. No.: 09/836,023

(22) Filed: Apr. 17, 2001

(65) Prior Publication Data
US 2002/0007935 A1 Jan. 24, 2002

Related U.S. Application Data

(60) Provisional application No. 60/198,424, filed on Apr. 19, 2000.

(51) Int. Cl.[7] .................................................. F28F 7/00
(52) U.S. Cl. ................................ 165/80.4; 165/104.33; 361/702
(58) Field of Search ......................... 165/80.4, 104.33, 165/104.26; 361/702, 700; 257/715, 716

(56) References Cited

U.S. PATENT DOCUMENTS

| | | | |
|---|---|---|---|
| 3,327,776 A | * 6/1967 | Butt | ........................... 361/702 |
| 3,817,321 A | 6/1974 | von Cube et al. | |
| 4,109,707 A | * 8/1978 | Wilson et al. | ............. 165/80.4 |
| 5,388,635 A | * 2/1995 | Gruber et al. | .............. 361/702 |
| 5,423,376 A | * 6/1995 | Julien et al. | ................ 165/80.4 |
| 5,713,413 A | 2/1998 | Osakabe et al. | |
| 5,737,923 A | * 4/1998 | Gilley et al. | ........... 165/104.33 |
| 6,305,463 B1 | * 10/2001 | Salmonson | ................ 165/80.3 |

FOREIGN PATENT DOCUMENTS

JP    6-164172 A  *  6/1994  ................. 361/702

* cited by examiner

Primary Examiner—Henry Bennett
Assistant Examiner—Terrell McKinnon
(74) Attorney, Agent, or Firm—Barbara Joan Haushalter

(57) ABSTRACT

An improved cold plate cooling system provides cooling away from the surface of electrical and electronic components with very low parasitic power consumption and very high heat transfer rates. The component to be cooled is in thermal contact with a cold plate. A fin material is inserted in the cold plate and refrigerant is circulated through the fin, allowing the cold plate and fin to transfer heat from the electrical or electronic components, as the liquid refrigerant is at least partially evaporated by the heat generated by the components.

10 Claims, 8 Drawing Sheets

COLD PLATE UTILIZING FIN WITH EVAPORATING REFRIGERANT

RELATED APPLICATIONS

This is a regularly filed application, based on provisional application Serial No. 60/198,424, filed Apr. 19, 2000.

TECHNICAL FIELD

The present invention relates to cooling of electrical and electronic components, and more particularly, to a cold plate utilizing fin configurations with an evaporating refrigerant to cool electrical and electronic components.

BACKGROUND OF THE INVENTION

Electrical and electronic components (e.g. microprocessors, IGBT's, power semiconductors etc.) generate heat which must be removed for reliable operation and long life of the components. One method of removing this heat is to mount the component on a cold plate, which is in turn cooled by a fluid flowing through it. Cold plates use a liquid flowing through tubes or offset strip fins or convoluted fins to remove heat from a surface where electrical or electronic components are mounted. The liquid flowing through the cold plate removes heat by an increase in its sensible temperature, with no phase change being involved. The tube or fins are in thermal contact with a flat surface where the components are mounted by means of screws, bolts or clips. A thermal interface material is usually employed to reduce the contact resistance between the component and the cold plate surface. There are many types of cold plate designs, some of which involve machined grooves instead of tubing to carry the fluid. However, all cold plate designs operate similarly by using the sensible heating of the fluid to remove heat. The heated fluid then flows to a remotely located air-cooled coil where ambient air cools the fluid before it returns to the pump and begins the cycle again.

Modern electrical and electronic components are required to dissipate larger quantities of heat at ever increasing heat flux densities. It is therefore very difficult to cool these components by sensible cooling only. For every watt of heat dissipated, the cooling fluid must increase in temperature; or if the temperature rise is fixed, the flow rate of fluid must increase. This causes either large fluid flow rates, or large temperature differences, or both. As fluid flow rate increases, pumping power goes up, as does this size of pumps required. This can cause unacceptable parasitic power consumption, equipment packaging difficulties, and even erosion of cold plate passages due to high fluid velocities. As the temperature rise of the cooling fluid increases, sometimes the allowable temperature of the device or component may be exceeded, causing premature failure.

It is seen then that there exists a continuing need for an improved method of removing heat from a surface where electrical or electronic components are mounted, particularly with the dissipation of larger quantities of heat at ever increasing heat flux densities being required.

SUMMARY OF THE INVENTION

This need is met by the present invention, which uses fin in multiple configurations, constructed as a part of a cold plate. The fin can be a high surface area offset strip fin, a plain convoluted fin, or other fin configurations. The cold plate of the present invention uses a vaporizable refrigerant as the fluid medium, passing through the fin configuration, to efficiently remove heat from components or devices mounted on the surface of the cold plate.

In accordance with one aspect of the present invention, an improved cold plate cooling system provides cooling away from the surface of the electrical and electronic components with very low parasitic power consumption and very high heat transfer rates. The component to be cooled is in thermal contact with a cold plate. A fin material is inserted in the cold plate and refrigerant is circulated through the fin, allowing the cold plate and fin to transfer heat from the electrical or electronic components, as the liquid refrigerant is at least partially evaporated by the heat generated by the components.

Accordingly, it is an object of the present invention to provide cooling to electrical and electronic components. It is a further object of the present invention to provide cooling across large surface areas. It is yet another object of the present invention to provide nearly isothermal cooling to electrical and electronic components.

Other objects and advantages of the invention will be apparent from the following description, the accompanying drawings and the appended claims.

DETAILED DESCRIPTION OF THE PREFERRED EMBODIMENTS

The present invention proposes using fin in a cold plate, and passing a vaporizable refrigerant through the fin to remove heat from electrical and electronic components mounted to the surface of the cold plate. The refrigerant may be any suitable vaporizable refrigerant, such as, for example, R-134a. A cooling system which circulates a refrigerant as the working fluid is described and claimed in commonly assigned, co-pending application Ser. No. 09/819,591 (Attorney Docket TFF001PA), totally incorporated herein by reference.

Figure 1:
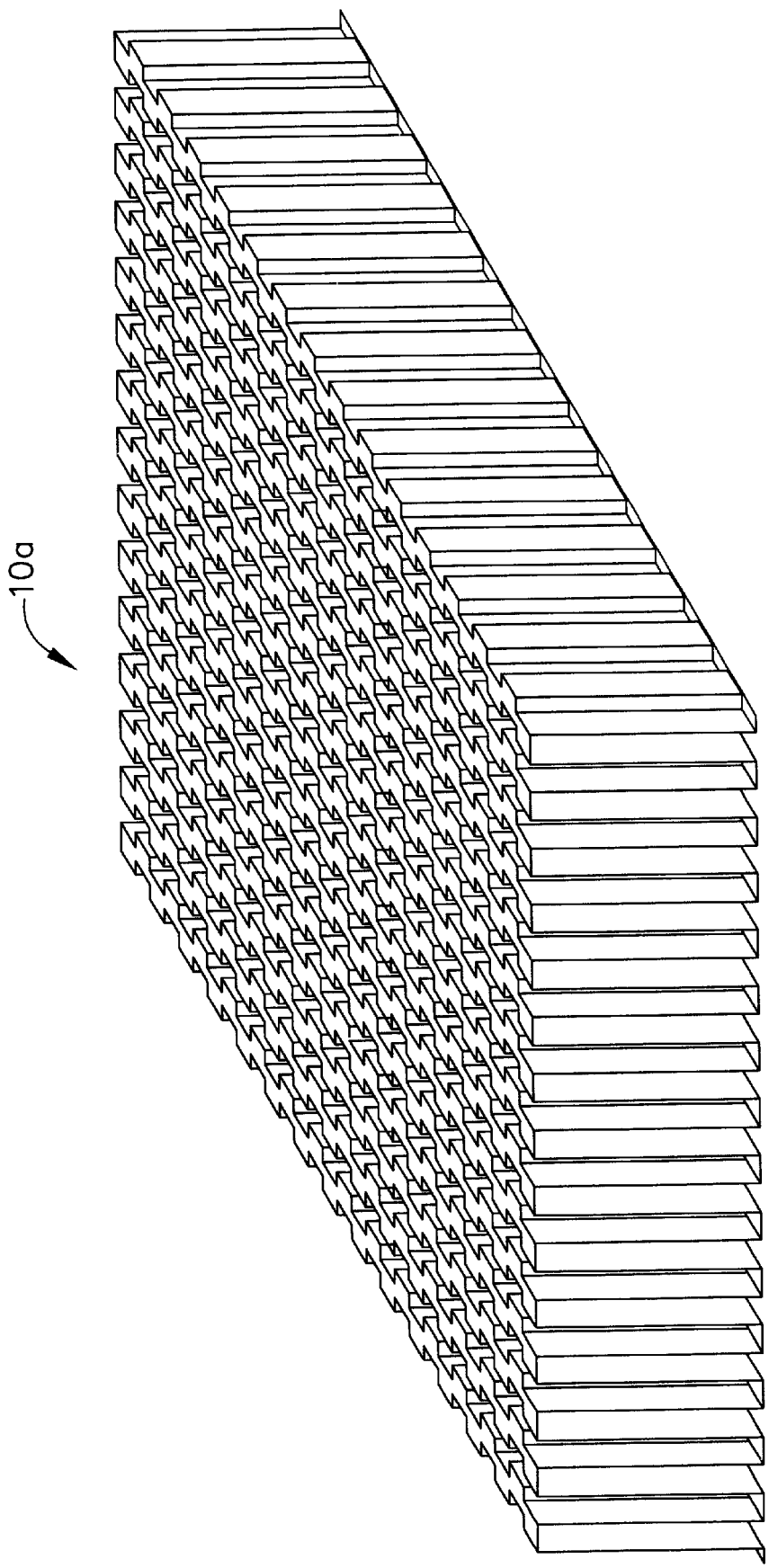
FIGS. 1–3 are illustrations of fin configurations, including lanced and offset, plain, and ruffled, respectively.
Figure 2:
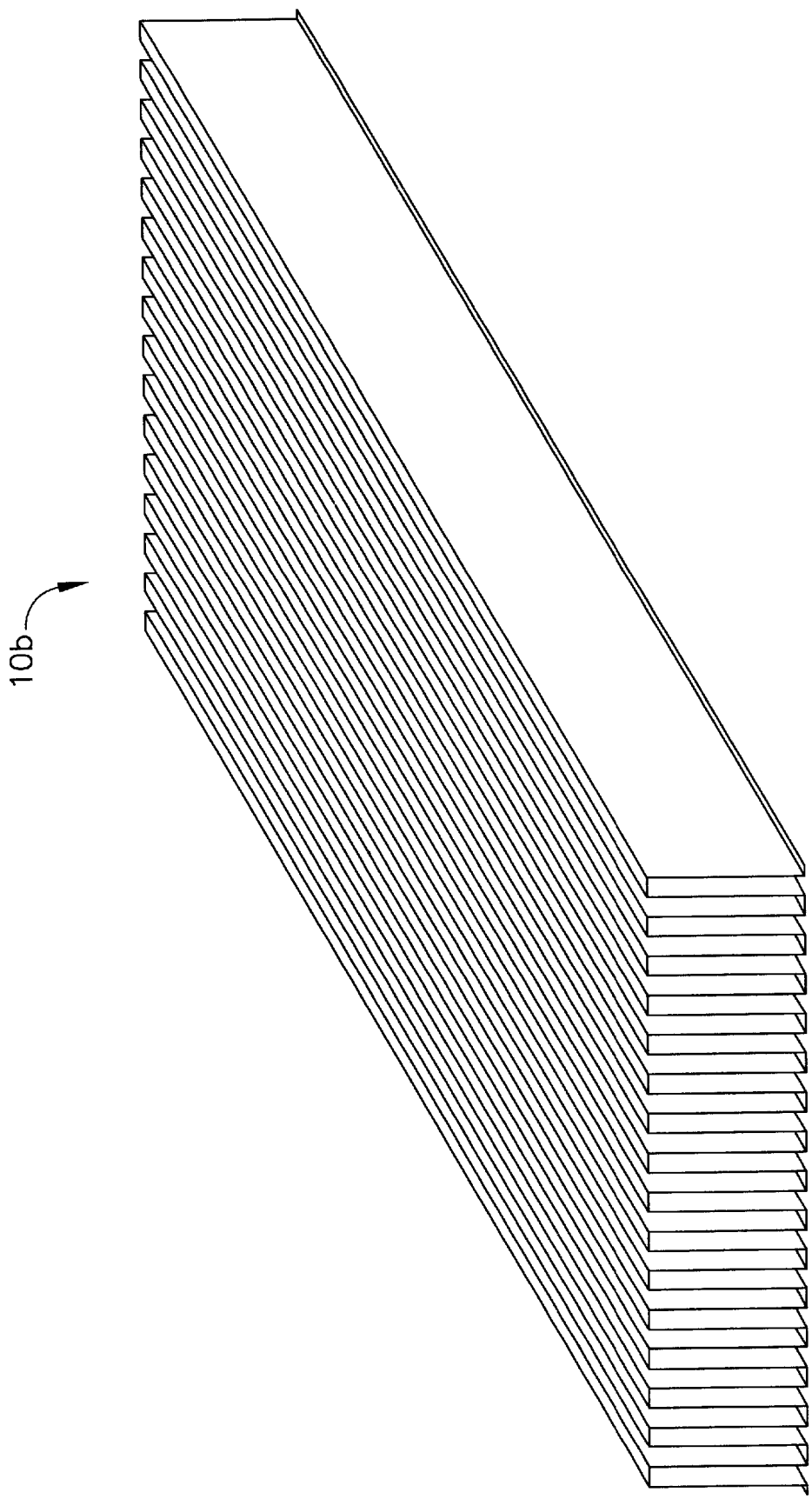
Figure 3:
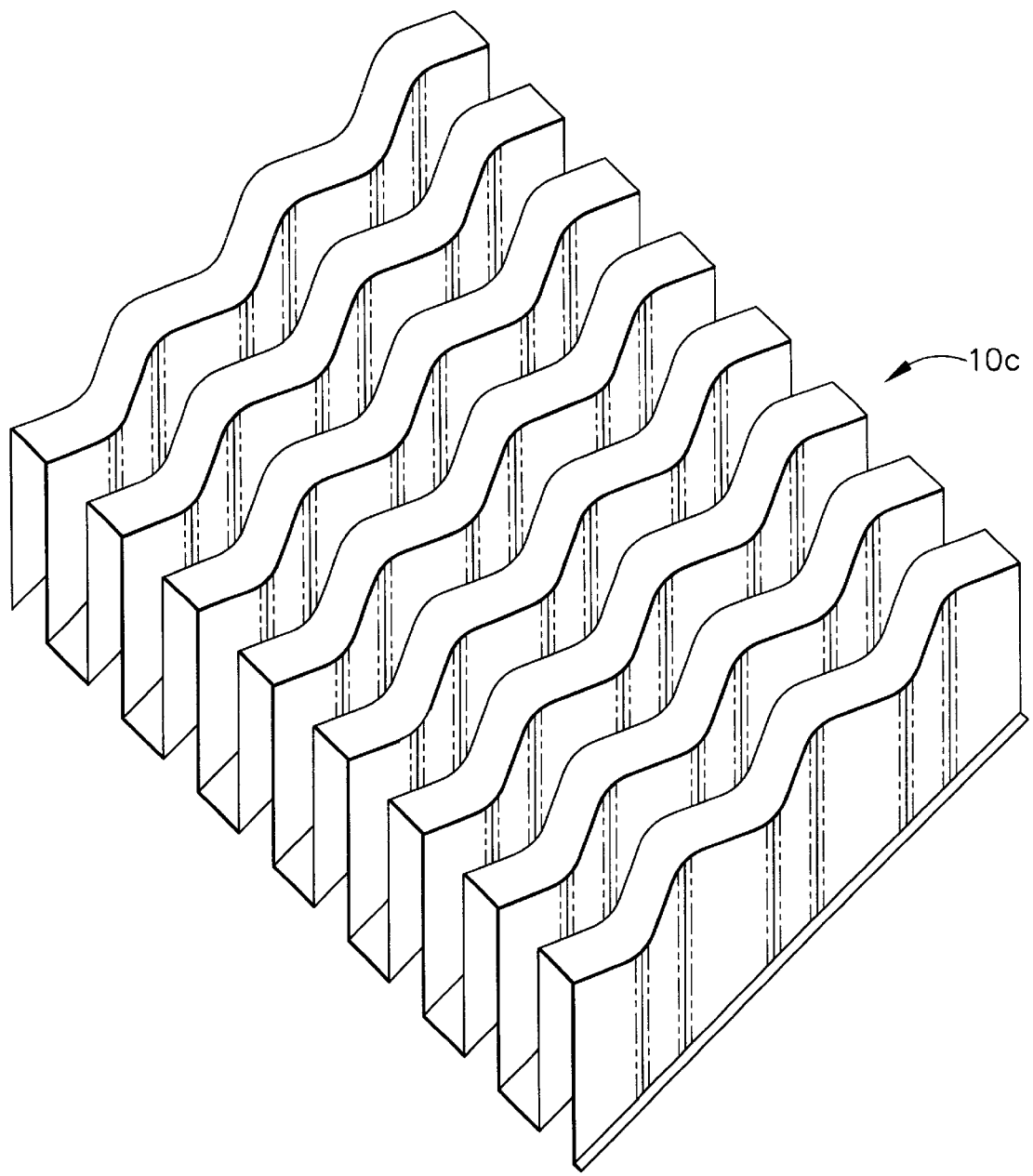

The present invention proposes inserting fin into a cold plate, such as by brazing or otherwise associating the fin with the cold plate. The cold plate/fin cooling system uses a vaporizable refrigerant as the fluid medium through the fin to remove heat from components or devices in thermal contact with the cold plate. The cold plate acts as an evaporator, causing the refrigerant to vaporize and remove heat from the surface where the components are mounted. The fin configuration mounted integral to the cold plate helps to more efficiently transfer the heat and move the heat to the evaporating refrigerant. The fin configuration may be any suitable fin configuration, such as, for example, fin 10a of FIG. 1 which illustrates lanced and offset convoluted fin; fin 10b of FIG. 2, which illustrates plain convoluted fin; fin 10c of FIG. 3, which illustrates ruffled convoluted fin; or other suitable fin configurations such as are manufactured and sold by Robinson Fin Machines, Inc., of Kenton, Ohio. Fin manufactured by Robinson Fin Machines, and suitable for application in the cold plate design of the present invention, can include any plain, ruffled, or louvered fin, with any manufacturable offset or crest configuration. The fin is available in a variety of materials suitable for heat transfer applications such as copper and aluminum. The particular fin configuration for each application can be selected based on the allowable pressure drop and required two phase heat transfer coefficient of the particular cooling system.

In accordance with the present invention, a cooling system 12, as illustrated in FIGS. 4–8, uses fin 10, such as fin 10a, 10b, or 10c, in any of a number of configurations to construct a cold plate 14, for efficiently transferring heat. The cooling system 12 uses a vaporizable refrigerant directed through the system 12 in the direction of arrow 16 as the fluid medium to remove heat from components or devices 18 mounted on, or otherwise in thermal contact with, the surface 20 of cold plate 14.

Figure 4:
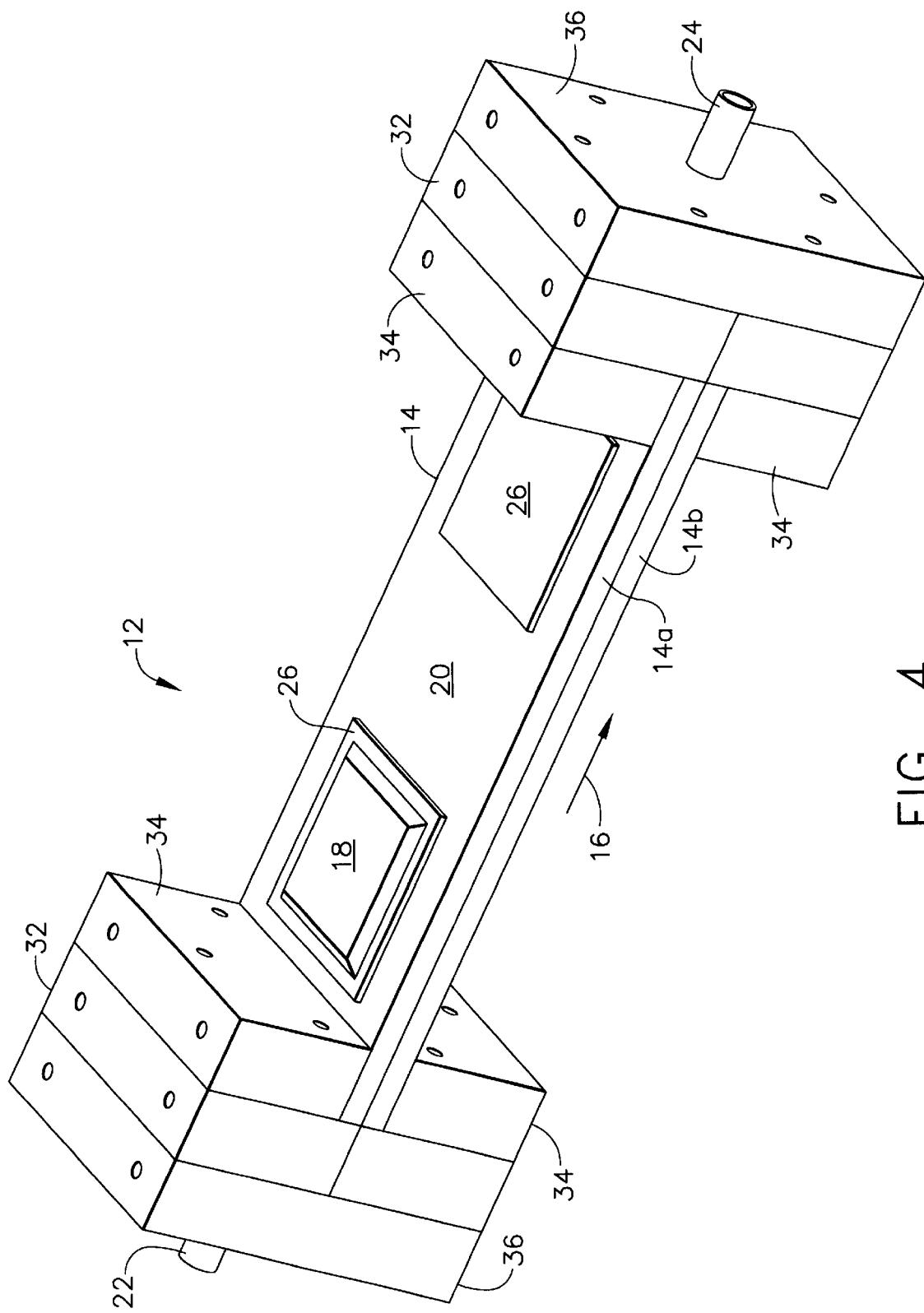
FIGS. 4–8 illustrate a cold plate assembly constructed in accordance with the present invention, using fin configurations such as are illustrated in FIGS. 1–3.
Figure 5:
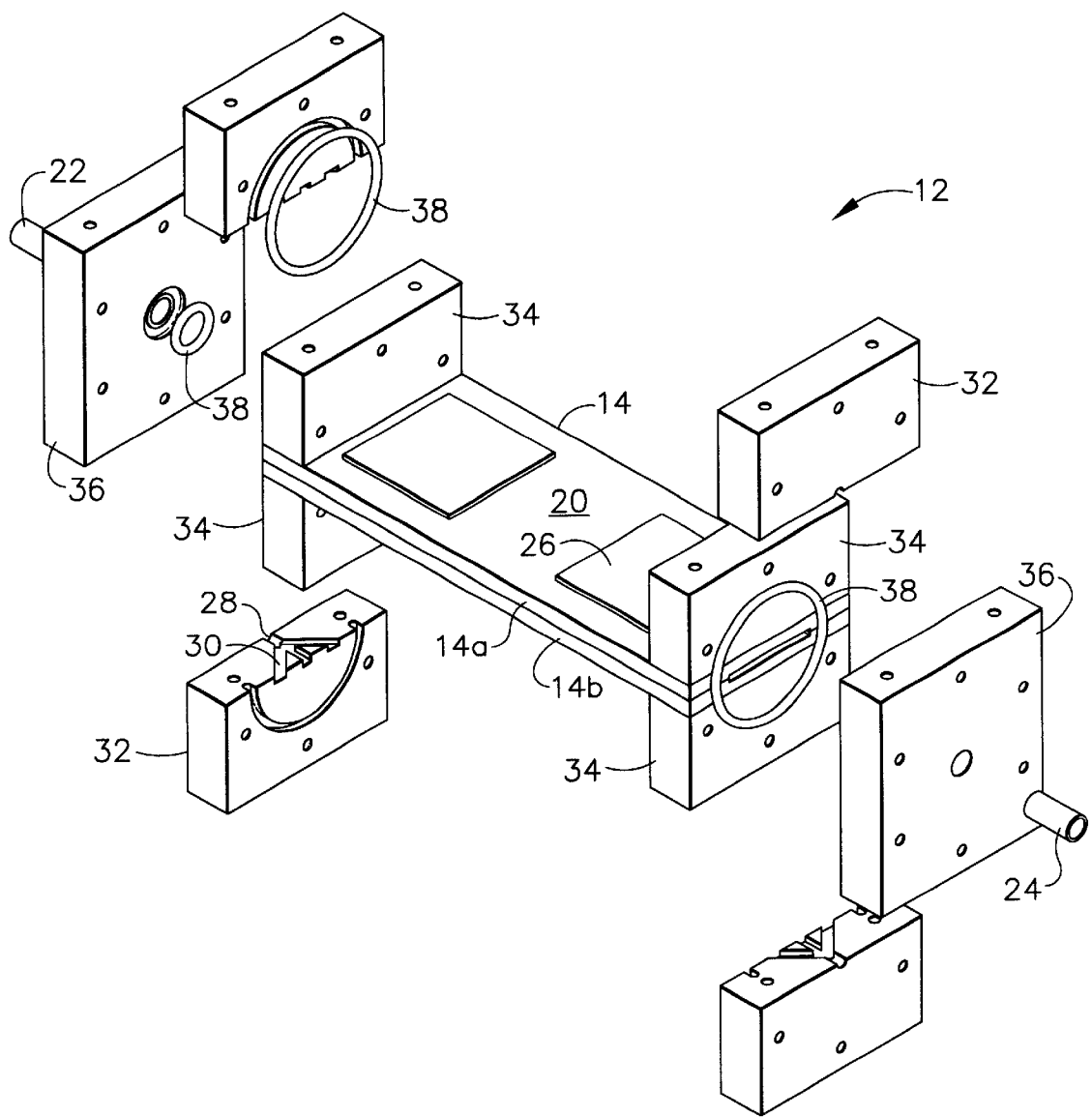

As illustrated in FIGS. 4 and 5, refrigerant enters the system 12 at a refrigerant inlet 22, and exits the system 12 at a refrigerant outlet 24. The refrigerant is evaporating as it flows through the cold plate. FIG. 4 illustrates the completed cold plate 14 assembly. For purposes of illustration only, and not to be considered as limiting the scope of the invention, a heat generating electrical or electronic component 18 is shown as being mounted to a flat area 26 on surface 20 of the cold plate 14. However, it will be obvious to those skilled in the art that the actual means for mounting or attaching the components 18 to the cold plate 14 can be any suitable means which put the components 18 in thermal contact with the cold plate 14, such as but not limited to thermally conductive adhesive, bolting, clips, clamping, or other mechanical means, and soldering.

Referring now to FIG. 5, there is illustrated a partially exploded view of the cold plate 14 assembly of FIG. 4. In FIG. 5, the refrigerant inlet 22 and outlet 24 are shown, as well as a liquid refrigerant distribution means 28. The liquid refrigerant distribution means 28 comprises a plurality of grooves or channels 30, formed in member 32 of assembly 12. The arrangement of the flow channels 30 are intended to enhance the introduction of the fluid medium to the fin configuration. Therefore, the arrangement can vary, depending on the size and type of fin used, and the heat transfer requirements of the particular system.

Figure 6:
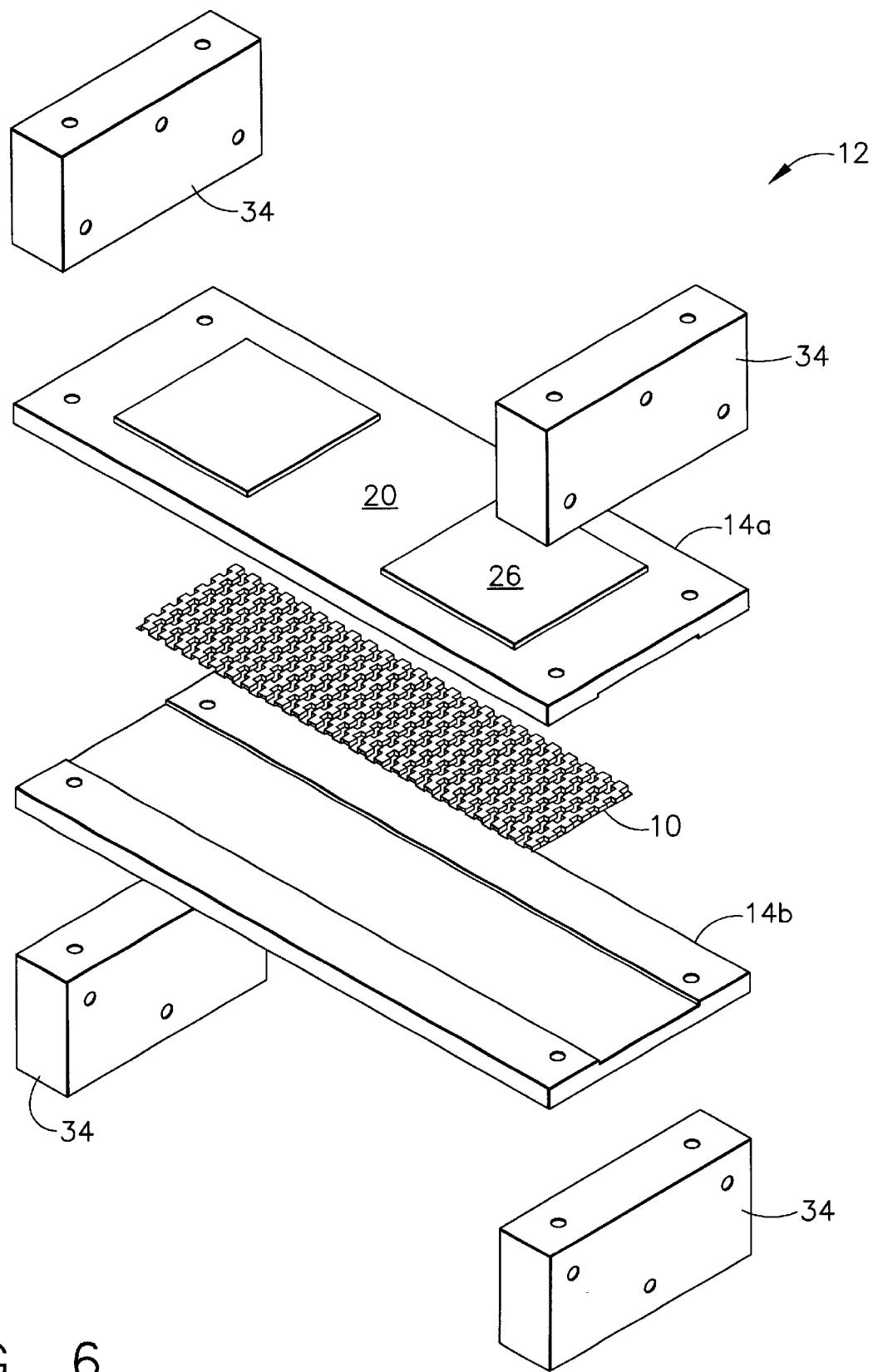

FIG. 6 illustrates an exploded view of the cold plate body 14 with the fin 10 visible. In a preferred embodiment of the present invention, the assembly 12 is designed to be brazed, so that the fin 10 becomes integral with and a part of the structural support of top and bottom plates 14a and 14b, respectively. The fin 10 is in intimate heat transfer contact with both plates 14a and 14b. Members 34 can be used to hold the plates 14a and 14b together, maintaining the fin 10 in heat transfer contact with the plates.

Figure 7:
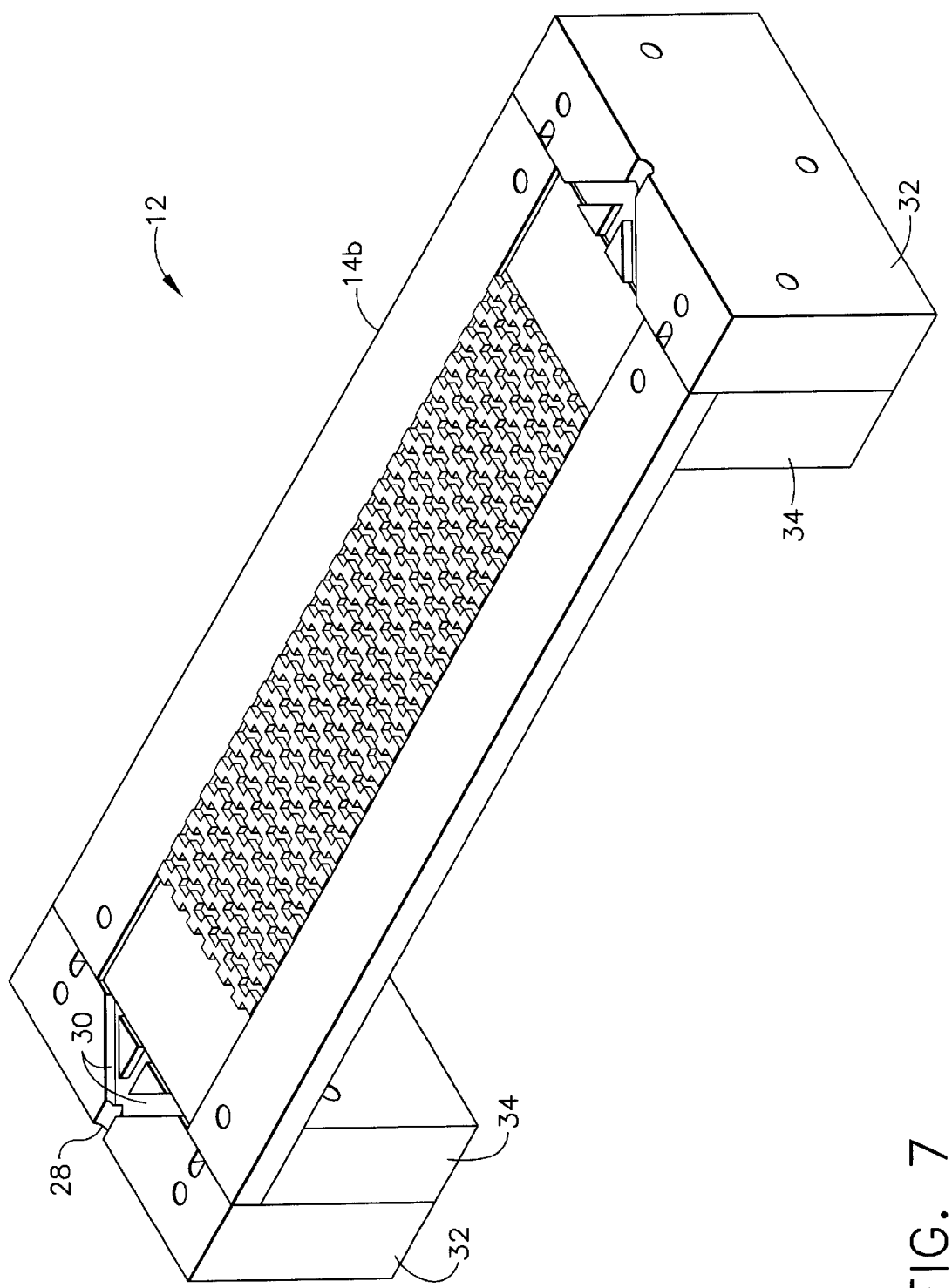

FIG. 7 is a cutaway view showing the liquid refrigerant distribution means 28 and the fin 10 sitting on bottom plate 14b. Also shown is the transition from channels 30 to a tube type structure for allowing the refrigerant to exit the cold plate via outlet 24 of FIGS. 4 and 5. The cold plate with the fin, as best illustrated in FIGS. 6 and 7, allows distribution of liquid refrigerant into the flow channels 30, to evenly distribute the liquid throughout the fin 10 configuration. This prevents the formation of hot spots and pressure spikes during the cooling process. Introducing the liquid refrigerant to the fin 10 via channels 30 allows for efficient distribution of the fluid medium through the fin, and allows the fin to be used to control the boiling separation that is occurring as the liquid refrigerant absorbs heat from component(s) 18 and turns to vapor (as it boils). Some liquid refrigerant is therefore continuously moving through the fin 10. With the arrangement illustrated herein, the present invention does not need to increase the temperature of the cooling fluid to dissipate heat; rather, the heat generated by components 18 is absorbed, causing the refrigerant to boil, and turning the refrigerant from a liquid to a gas.

Figure 8:
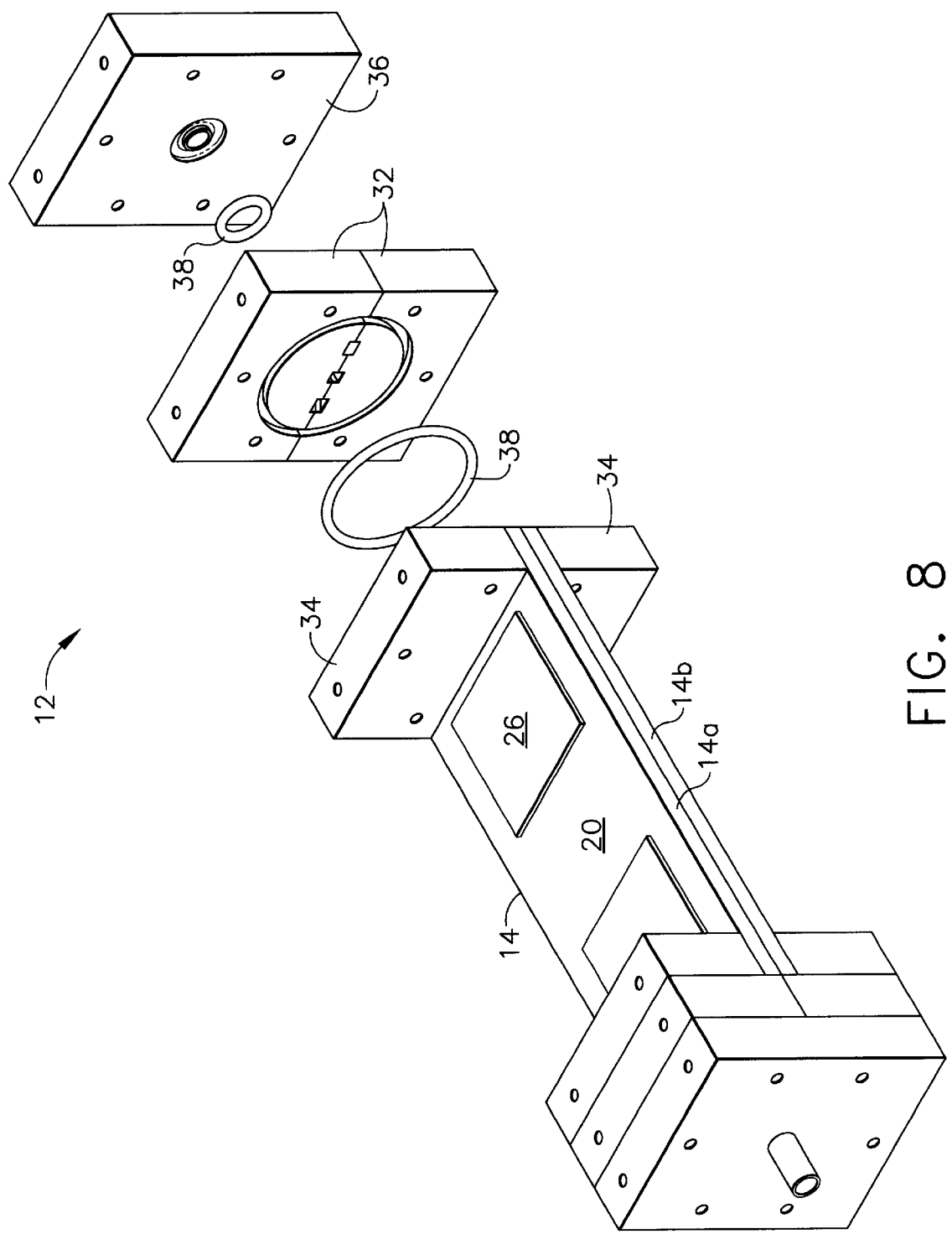

Referring now to FIG. 8, there is illustrated a view of one end of the cold plate assembly 12. Fin 10 is inserted between the top and bottom plates 14a and 14b, respectively, and members 34 hold the plates 14a and 14b together. Members 32 introduce the flow channels 30 to the system 12, to directionally affect the flow of refrigerant to the fin 10. Finally, members 36 retain the inlet 22 and the outlet 24, in fluid relationship with the flow channels 30. In a preferred embodiment of the present invention, the sections or members 32, 34 and 36 are sealed by O-rings 38, and external connections are made.

In a preferred embodiment of the present invention, the cold plate assembly 12 has been designed to use a fluorocarbon refrigerant, R-134a, which is non-toxic and has thermo physical properties particularly suitable for cooling applications, such as latent heat of vaporization, vapor pressure and compatibility with common materials of construction. However, it will be obvious to those skilled in the art that many other refrigerants may be used, depending on the specific thermal requirements of the system. These may include, but are not limited to, R-12, R-22, R-401a, R-401c, R-410a, R-508a, HP-80 and MP-39. The present invention introduces a vaporizable refrigerant to fin integrally associated with a cold plate to achieve benefits not previously realized with existing systems. The refrigerant may either completely or only partially evaporate, depending on the system heat load generated, as it flows through the cold plate. The heat transport mechanism is the evaporation of refrigerant removing heat from a surface where the components or devices are mounted.

The improved cold plate cooling system of the present invention, therefore, comprises at least one component that is generating heat and is required to be cooled. The cold plate is in thermal contact with the component(s), which cold plate has a fin configuration integral thereto. The fin configuration provides cooling across an entire desired area. The vaporizable refrigerant is circulated to the cold plate through the fin configuration, whereby the cold plate operates as an evaporator causing the vaporizable refrigerant to at least partially vaporize and remove heat generated by the component(s) from a surface of the cold plate. In accordance with the present invention, the fin configuration is located to control liquid-gas two phase flow of the vaporizable refrigerant.

In a preferred embodiment of the invention, a refrigerant inlet and a refrigerant outlet are associated with the cold plate and the fin configuration. A liquid form of the vaporizable refrigerant enters the cooling system at the inlet and passes through the fin configuration, turning to vapor as heat is removed from the component and leaving as vapor or a mixture of liquid and vapor. By using a vaporizable refrigerant, in combination with the fin configuration, several major improvements over conventional cold plates are realized. First, since the latent heat of vaporization of refrigerants is much higher than the sensible heat capacity of ordinary fluids, the mass flow rate required for a given amount of cooling is much less than in a conventional cooling system. Pumping power is reduced and line sizes along with flow area are also reduced, resulting in more cost effective systems. As the refrigerant evaporates, the latent heat is added at a constant temperature as with any single-phase evaporation process. This allows the cold plate to remove heat nearly isothermally, keeping the components and devices cooler than is possible with prior art systems.

Furthermore, evaporation of refrigerant in the cold plate allows for much higher heat flux densities than in conventional cold plates. This is due to the much higher boiling heat transfer coefficients, as compared to the single phase forced convection coefficients in the prior art. High performance microprocessors with small silicon die and high heat flux densities can be cooled effectively with the cooling system of the present invention.

With a cooling system constructed in accordance with the present invention, the use of offset strip fin or convoluted fin as the evaporating surface allows the cold plate to be cooled uniformly over the entire surface, unlike cold plates with tubes mounted to flat surfaces where thermal spreading is a consideration. The use of fin in a cold plate evaporator, as taught by the subject invention, allows for the mounting of components almost anywhere on the cold plate, since nearly the entire surface of the cold plate is uniformly cooled.

Having described the invention in detail and by reference to the preferred embodiment thereof, it will be apparent that other modifications and variations are possible without departing from the scope of the invention defined in the appended claims.

What is claimed is:

1. An improved cold plate cooling system comprising:
   at least one component generating heat and required to be cooled;
   a cold plate in thermal contact with the at least one component to be cooled;
   a fin configuration integral with the cold plate, the fin configuration having a flow length;
   a vaporizable refrigerant circulated to the cold plate through the flow length of the fin configuration, whereby the cold plate operates as an evaporator causing the vaporizable refrigerant to at least partially vaporize and remove heat generated by the at least one component from a surface of the cold plate; and
   a single refrigerant inlet and a single refrigerant outlet associated with the cold plate and the fin configuration whereby a liquid form of the vaporizable refrigerant enters the cooling system at the inlet and passes through the fin configuration, turning to vapor as heat is removed from the component and leaving as vapor or a mixture of liquid and vapor.

2. An improved cooling system as claimed in claim 1 further comprising a plurality of flow channels to directionally affect the flow of the vaporizable refrigerant to the fin configuration.

3. An improved cooling system as claimed in claim 1 wherein the fin configuration is located to control liquid-gas two phase flow of the vaporizable refrigerant.

4. An improved cooling system as claimed in claim 1 wherein the fin configuration provides cooling across an entire desired area.

5. An improved cooling system as claimed in claim 1 wherein the refrigerant comprises R-134a refrigerant.

6. A method for cooling one or more electrical or electronic components generating heat and required to be cooled, the components associated with a cold plate, the method comprising the steps of:
   locating the cold plate in thermal contact with the one or more electrical or electronic components;
   integrating a fin configuration into the cold plate, the fin configuration having a flow length;
   circulating a vaporizable refrigerant to the cold plate through the flow length of the fin configuration, whereby the cold plate operates as an evaporator causing the vaporizable refrigerant to at least partially vaporize and remove heat generated by the at least one component from a surface of the cold plate;
   providing a single refrigerant inlet associated with the cold plate and the fin configuration; and
   providing a single refrigerant outlet associated with the cold plate and the fin configuration, whereby a liquid form of the vaporizable refrigerant enters at the inlet and passes through the fin configuration, turning to vapor as heat is removed from the component and leaving as vapor or a mixture of liquid and vapor.

7. A method as claimed in claim 6 further comprising the step of providing a plurality of flow channels to directionally affect the flow of the vaporizable refrigerant to the fin configuration.

8. A method as claimed in claim 6 wherein the fin configuration is located to control liquid-gas two phase flow of the vaporizable refrigerant.

9. A method as claimed in claim 6 wherein the fin configuration provides cooling across an entire desired area.

10. A method as claimed in claim 6 wherein the refrigerant comprises R-134a refrigerant.

* * * * *